US012488968B2

(12) United States Patent
Chen et al.

(10) Patent No.: US 12,488,968 B2
(45) Date of Patent: Dec. 2, 2025

(54) SEMICONDUCTOR PROCESSING TOOL AND METHODS OF OPERATION

(71) Applicant: Taiwan Semiconductor Manufacturing Company, Ltd., Hsinchu (TW)

(72) Inventors: Liang Yu Chen, Hsinchu (TW); Yu-Chi Lin, Hsinchu (TW); Yu Hsi Tang, Hsinchu (TW); Chih-Teng Liao, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 778 days.

(21) Appl. No.: 17/660,249

(22) Filed: Apr. 22, 2022

(65) Prior Publication Data

US 2023/0343567 A1 Oct. 26, 2023

(51) Int. Cl.
*H01J 37/32* (2006.01)
*H01L 21/311* (2006.01)

(52) U.S. Cl.
CPC .... *H01J 37/32834* (2013.01); *H01J 37/3244* (2013.01); *H01J 37/32522* (2013.01); *H01J 37/3299* (2013.01); *H01J 2237/3343* (2013.01); *H01L 21/31116* (2013.01)

(58) Field of Classification Search
None
See application file for complete search history.

(56) References Cited

U.S. PATENT DOCUMENTS

| 2016/0003251 | A1* | 1/2016 | Nonomura | F04B 45/047 417/32 |
| 2019/0172689 | A1* | 6/2019 | Nagaseki | H01J 37/32633 |
| 2019/0194102 | A1* | 6/2019 | Tachibana | C07C 37/82 |
| 2020/0109712 | A1* | 4/2020 | Maishigi | F04C 28/28 |
| 2022/0186734 | A1* | 6/2022 | Lill | F04D 19/042 |
| 2022/0314595 | A1* | 10/2022 | Huang | B32B 38/1858 |
| 2022/0333989 | A1* | 10/2022 | Erickson | G01J 3/0291 |
| 2023/0243359 | A1* | 8/2023 | Takahashi | F04D 19/04 417/423.4 |

\* cited by examiner

*Primary Examiner* — Binh X Tran
(74) *Attorney, Agent, or Firm* — Harrity & Harrity, LLP

(57) ABSTRACT

Some implementations described herein provide techniques and apparatuses for improving a uniformity of a flow of a gas across a semiconductor substrate in an etch tool. The etch tool includes an exhaust port located at a bottom center of a chamber of the etch tool. The etch tool further includes a flow-control subsystem that includes an impeller and a thermal component. As a result of the flow-control subsystem varying a rotational velocity of the impeller, and/or an amount of heat transferred from the thermal component, the uniformity of the flow of the gas across the semiconductor substrate may be improved. In this way, a uniformity of an etching rate may be increased and contamination defects due to a clustering of particulates may be decreased, resulting in an increase in a yield of semiconductor product fabricated using the etch tool.

20 Claims, 13 Drawing Sheets

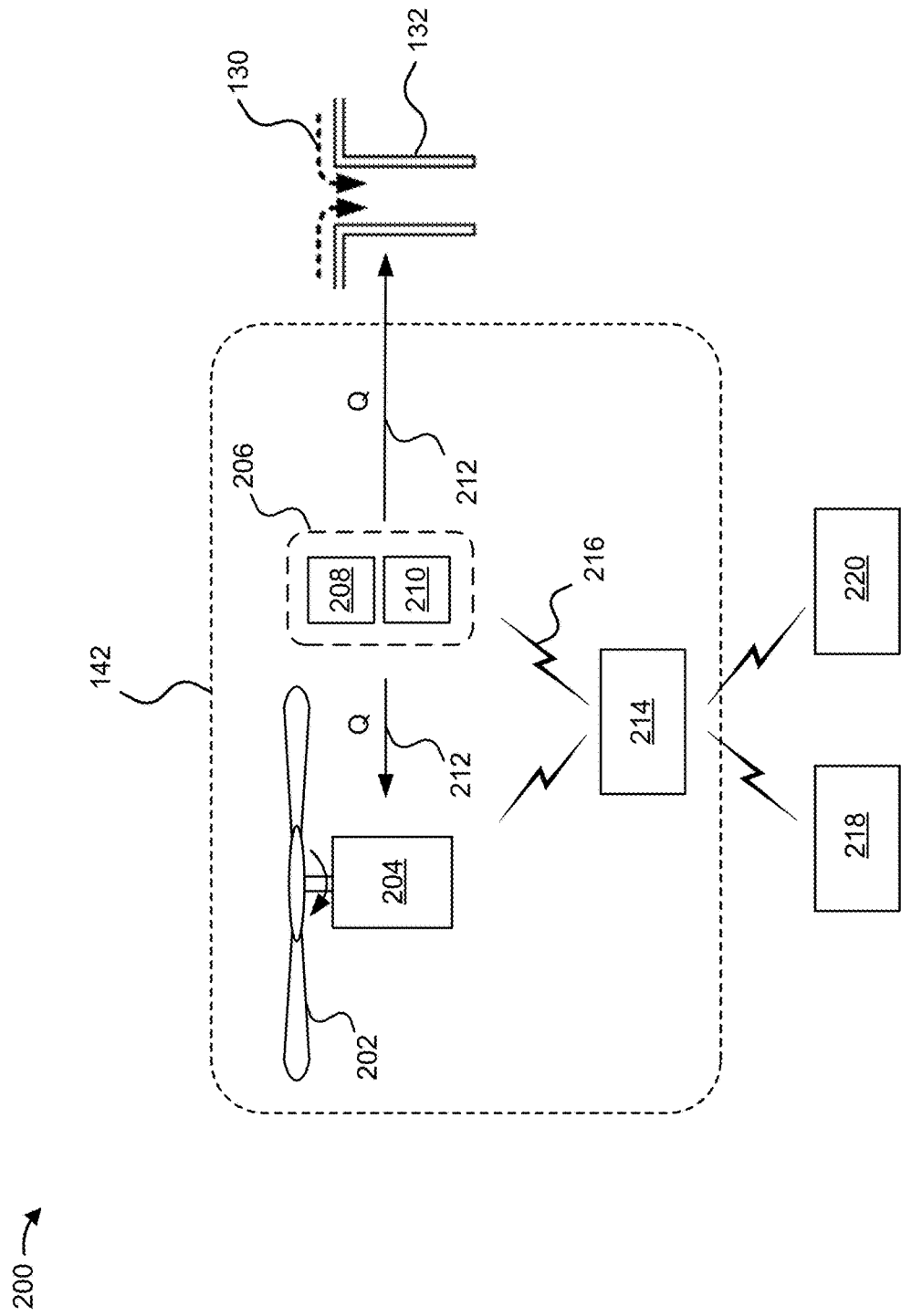

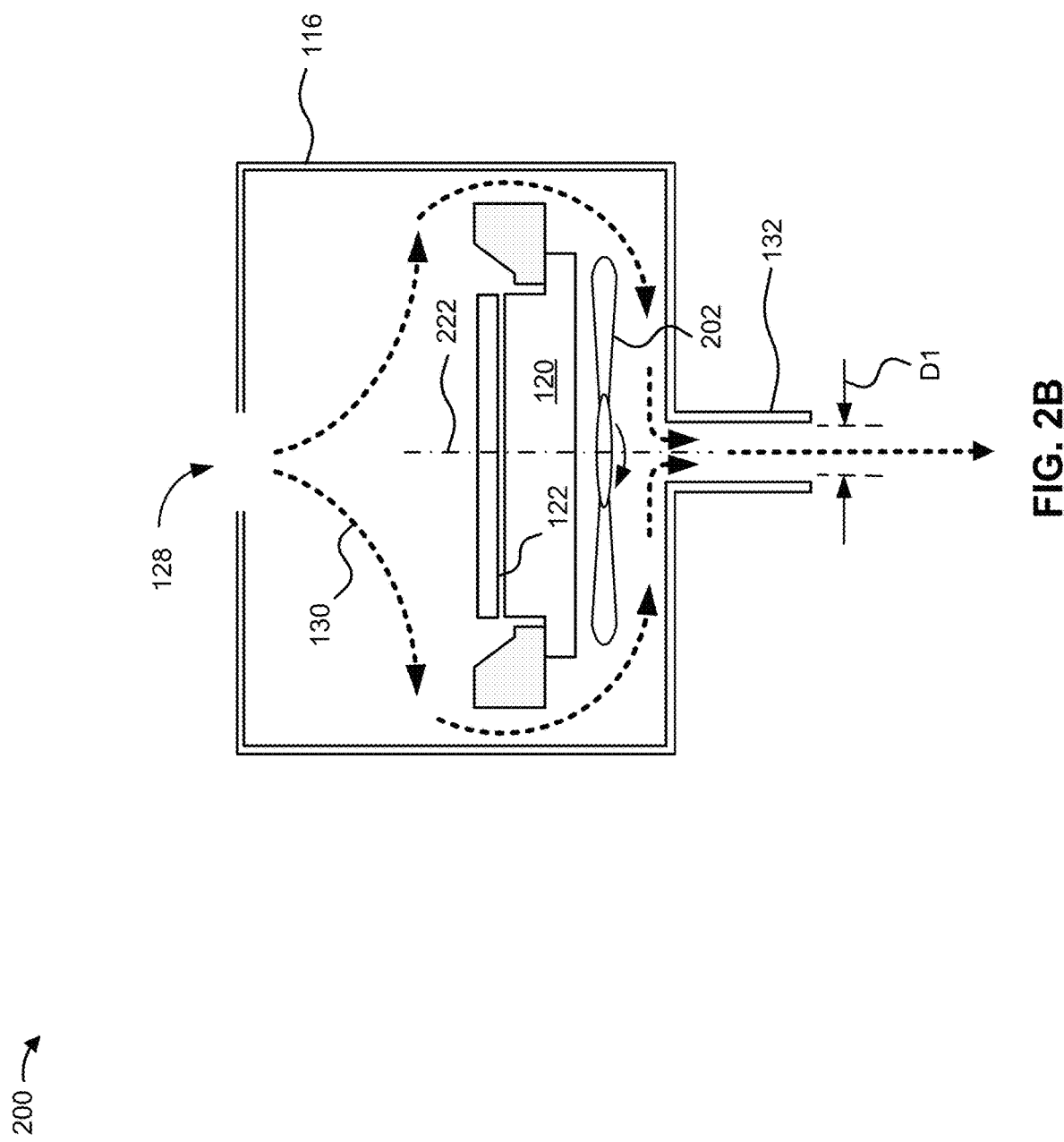

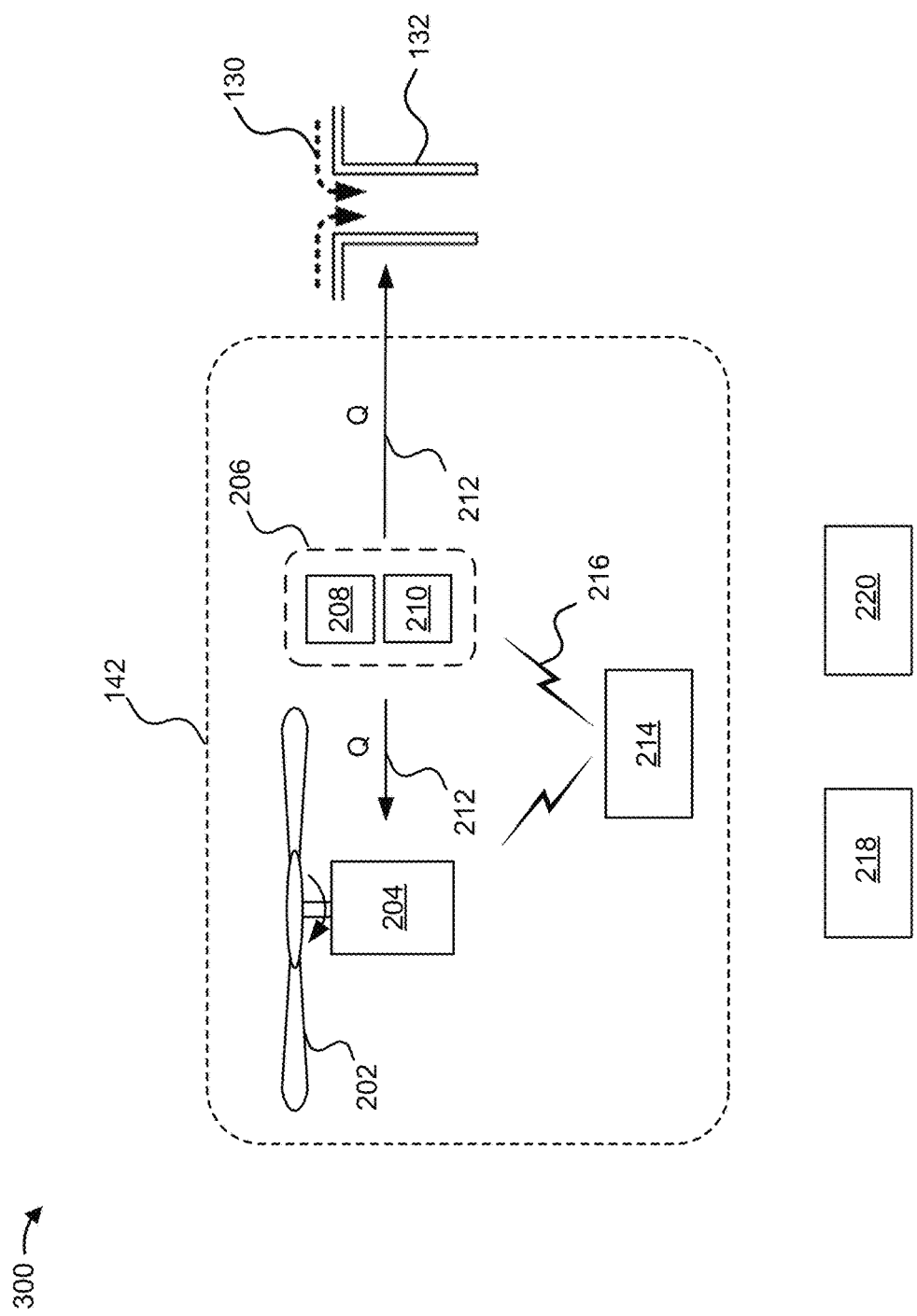

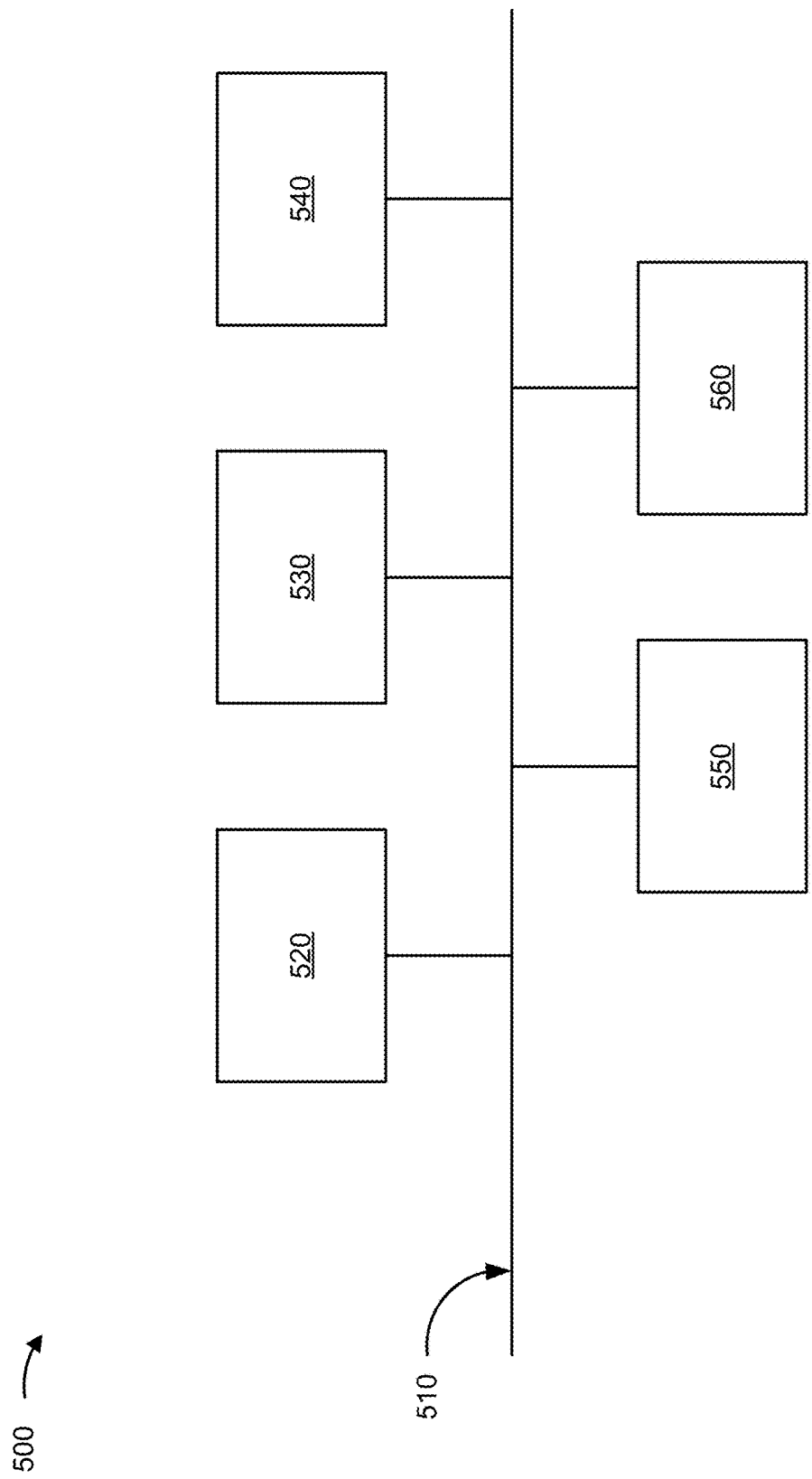

SEMICONDUCTOR PROCESSING TOOL AND METHODS OF OPERATION

BACKGROUND

A plasma-based semiconductor processing tool may be used to etch various types of semiconductor materials from a substrate. Examples of plasma-based semiconductor processing tools include a decoupled plasma source (DPS) tool, an inductively coupled plasma (ICP) tool, and a transformer coupled plasma (TCP) tool.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A-2C are diagrams of an example implementation of a flow-control subsystem described herein.

FIGS. 3A-3C are diagrams of an example implementation described herein.

FIG. 5 is a diagram of example components of one or more devices of FIG. 1 described herein.

DETAILED DESCRIPTION

Figure 1A:
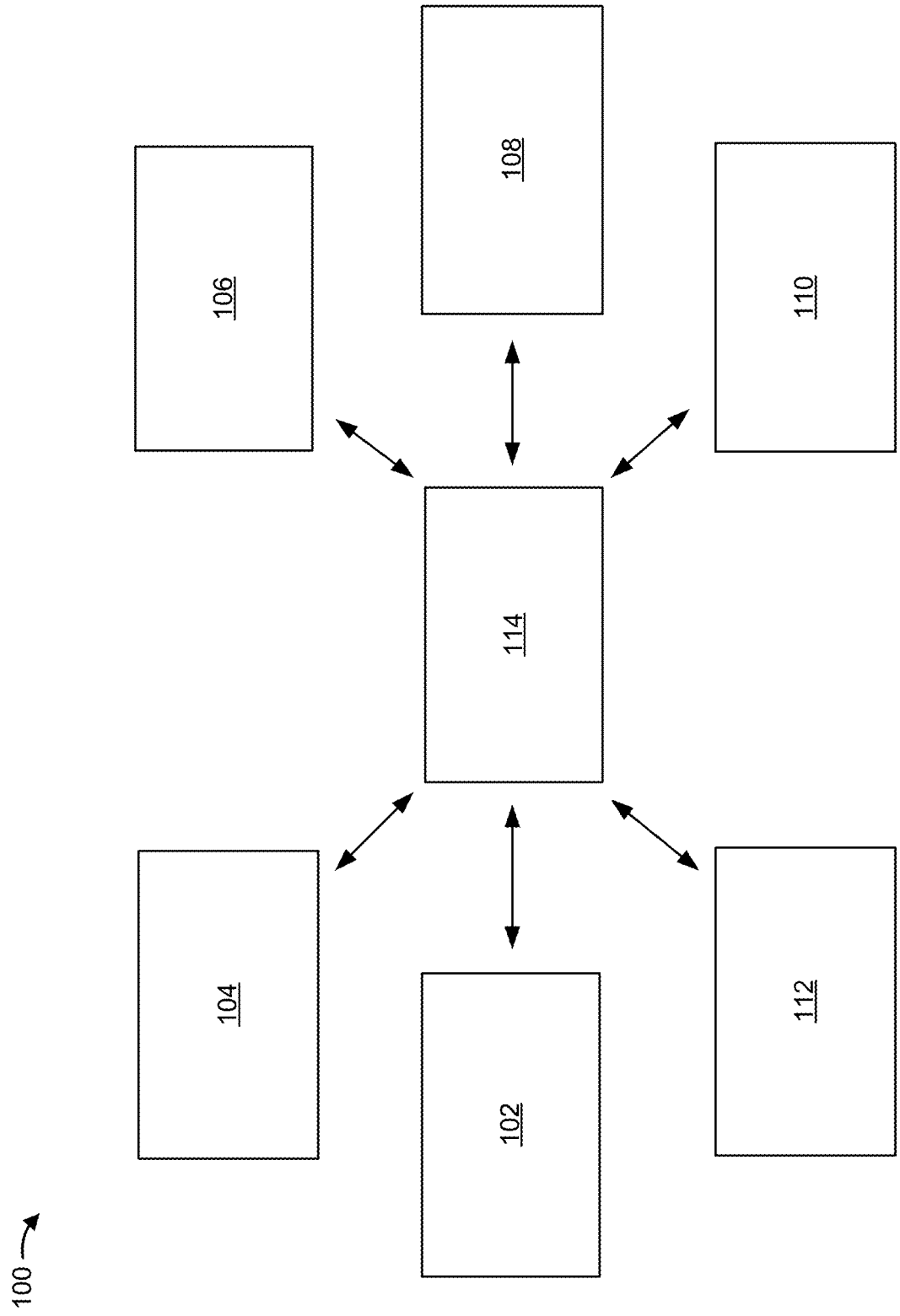
FIGS. 1A and 1B are diagrams of an example semiconductor processing environment including an etch tool described herein.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some cases, a plasma-based semiconductor processing tool (e.g., an etch tool) may include a processing chamber. During an etching process, one or more gases used to remove the material may flow across a surface of the semiconductor substrate and to an exhaust port (e.g. a pumping port) located at an edge region of the processing chamber. The location of the exhaust port may cause a non-uniform gas flow across the semiconductor substrate, resulting in a non-uniform etching rate across the semiconductor substrate and a clustering of particles at an edge of the substrate near the exhaust port. The non-uniform etching rate and the clustering of particulates at the edge of the substrate may decrease a yield of semiconductor product fabricated using the etch tool.

Some implementations described herein provide techniques and apparatuses for improving a uniformity of a flow of a gas across a semiconductor substrate in an etch tool. The etch tool includes an exhaust port located at a bottom center of a chamber of the etch tool. The etch tool further includes a flow-control subsystem that includes an impeller and a thermal component. As a result of the flow-control subsystem varying a rotational velocity of the impeller, and/or an amount of heat transferred from the thermal component, the uniformity of the flow of the gas across the semiconductor substrate may be improved.

In this way, a uniformity of an etching rate may be increased and contamination defects due to a clustering of particulates may be decreased, resulting in an increase in a yield of semiconductor product fabricated using the etch tool. Furthermore, the increased uniformity in the etching rate may reduce an amount of time that the etch tool is operated to reduce a use of processing resources within the etch tool.

Figure 1B:
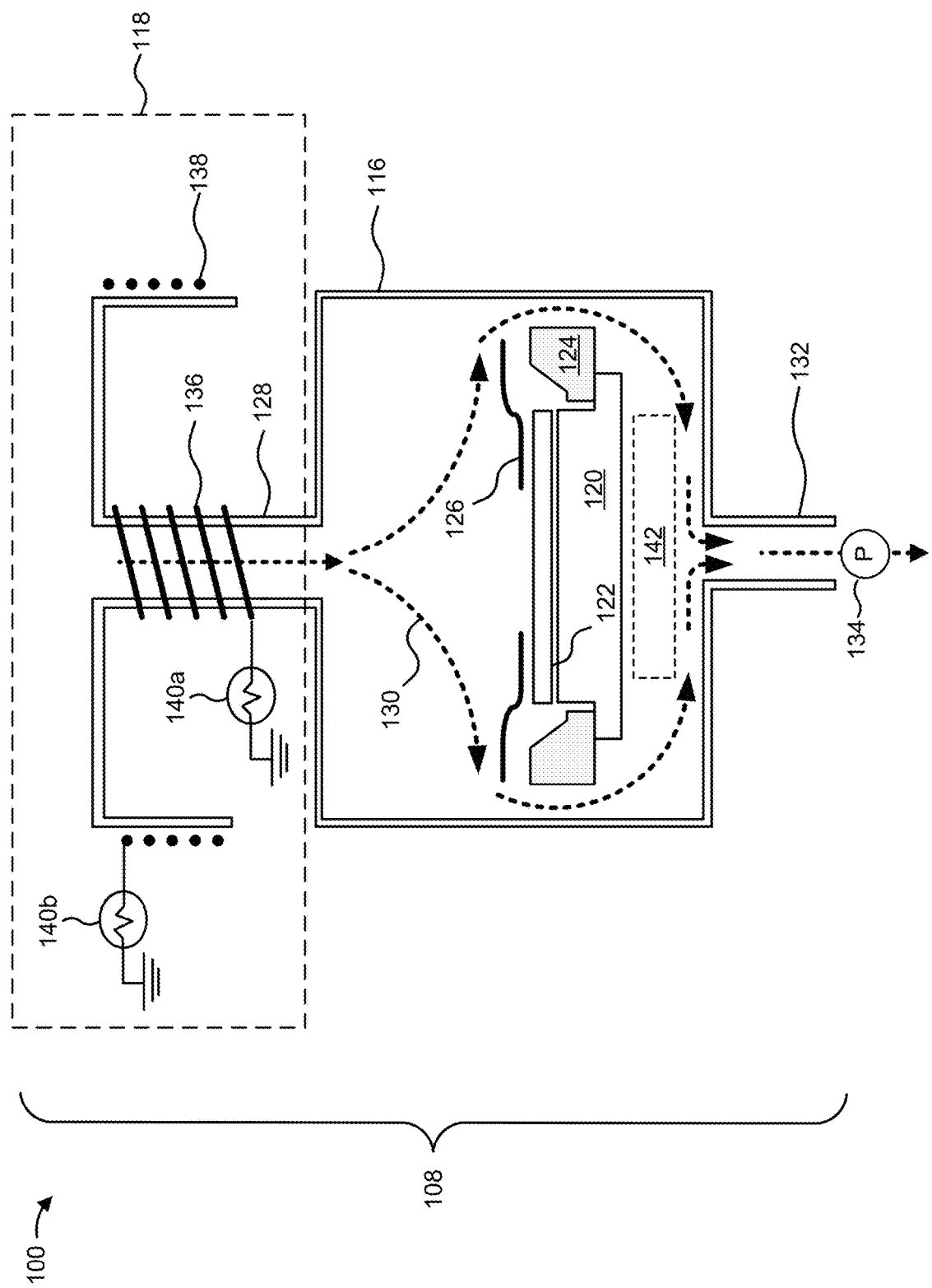

FIGS. 1A and 1B include diagrams of an example semiconductor processing environment including an etch tool described herein. As shown in FIG. 1A, environment 100 may include a plurality of semiconductor processing tools 102-112 and a wafer/die transport tool 114. The plurality of semiconductor processing tools 102-112 may include a deposition tool 102, an exposure tool 104, a developer tool 106, an etch tool 108, a planarization tool 110, a plating tool 112, and/or another type of semiconductor processing tool. The tools included in example environment 100 may be included in a semiconductor clean room, a semiconductor foundry, a semiconductor processing facility, and/or manufacturing facility, among other examples.

The deposition tool 102 is a semiconductor processing tool that includes a semiconductor processing chamber and one or more devices capable of depositing various types of materials onto a substrate. In some implementations, the deposition tool 102 includes a spin coating tool that is capable of depositing a photoresist layer on a substrate such as a wafer. In some implementations, the deposition tool 102 includes a chemical vapor deposition (CVD) tool such as a plasma-enhanced CVD (PECVD) tool, a high-density plasma CVD (HDP-CVD) tool, a sub-atmospheric CVD (SACVD) tool, a low-pressure CVD (LPCVD) tool, an atomic layer deposition (ALD) tool, a plasma-enhanced atomic layer deposition (PEALD) tool, or another type of CVD tool. In some implementations, the deposition tool 102 includes a physical vapor deposition (PVD) tool, such as a sputtering tool or another type of PVD tool. In some implementations, the deposition tool 102 includes an epitaxial tool that is configured to form layers and/or regions of a device by epitaxial growth. In some implementations, the example environment 100 includes a plurality of types of deposition tools 102.

The exposure tool 104 is a semiconductor processing tool that is capable of exposing a photoresist layer to a radiation source, such as an ultraviolet light (UV) source (e.g., a deep UV light source, an extreme UV light (EUV) source, and/or the like), an x-ray source, an electron beam (e-beam) source, and/or the like. The exposure tool 104 may expose a photoresist layer to the radiation source to transfer a pattern from a photomask to the photoresist layer. The pattern may include one or more semiconductor device layer patterns for forming one or more semiconductor devices, may include a pattern for forming one or more structures of a semiconductor device, may include a pattern for etching various portions of a semiconductor device, and/or the like. In some implementations, the exposure tool 104 includes a scanner, a stepper, or a similar type of exposure tool.

The developer tool 106 is a semiconductor processing tool that is capable of developing a photoresist layer that has been exposed to a radiation source to develop a pattern transferred to the photoresist layer from the exposure tool 104. In some implementations, the developer tool 106 develops a pattern by removing unexposed portions of a photoresist layer. In some implementations, the developer tool 106 develops a pattern by removing exposed portions of a photoresist layer. In some implementations, the developer tool 106 develops a pattern by dissolving exposed or unexposed portions of a photoresist layer through the use of a chemical developer.

The etch tool 108 is a semiconductor processing tool that is capable of etching various types of materials of a substrate, wafer, or semiconductor device. For example, the etch tool 108 may include a wet etch tool, a dry etch tool, a plasma-based etch tool, and/or the like. In some implementations, the etch tool 108 includes a chamber that is filled with an etchant, and the substrate is placed in the chamber for a particular time period to remove particular amounts of one or more portions of the substrate. In some implementations, the etch tool 108 may etch one or more portions of the substrate using a plasma etch or a plasma-assisted etch, which may involve using an ionized gas to isotropically or directionally etch the one or more portions.

The planarization tool 110 is a semiconductor processing tool that is capable of polishing or planarizing various layers of a wafer or semiconductor device. For example, a planarization tool 110 may include a chemical mechanical planarization (CMP) tool and/or another type of planarization tool that polishes or planarizes a layer or surface of deposited or plated material. The planarization tool 110 may polish or planarize a surface of a semiconductor device with a combination of chemical and mechanical forces (e.g., chemical etching and free abrasive polishing). The planarization tool 110 may utilize an abrasive and corrosive chemical slurry in conjunction with a polishing pad and retaining ring (e.g., typically of a greater diameter than the semiconductor device). The polishing pad and the semiconductor device may be pressed together by a dynamic polishing head and held in place by the retaining ring. The dynamic polishing head may rotate with different axes of rotation to remove material and even out any irregular topography of the semiconductor device, making the semiconductor device flat or planar.

The plating tool 112 is a semiconductor processing tool that is capable of plating a substrate (e.g., a wafer, a semiconductor device, and/or the like) or a portion thereof with one or more metals. For example, the plating tool 112 may include a copper electroplating device, an aluminum electroplating device, a nickel electroplating device, a tin electroplating device, a compound material or alloy (e.g., tin-silver, tin-lead, and/or the like) electroplating device, and/or an electroplating device for one or more other types of conductive materials, metals, and/or similar types of materials.

Wafer/die transport tool 114 includes a mobile robot, a robot arm, a tram or rail car, an overhead hoist transport (OHT) system, an automated materially handling system (AMHS), and/or another type of device that is configured to transport substrates and/or semiconductor devices between semiconductor processing tools 102-112, that is configured to transport substrates and/or semiconductor devices between processing chambers of the same semiconductor processing tool, and/or that is configured to transport substrates and/or semiconductor devices to and from other locations such as a wafer rack, a storage room, and/or the like. In some implementations, wafer/die transport tool 114 may be a programmed device that is configured to travel a particular path and/or may operate semi-autonomously or autonomously. In some implementations, the environment 100 includes a plurality of wafer/die transport tools 114.

For example, the wafer/die transport tool 114 may be included in a cluster tool or another type of tool that includes a plurality of processing chambers, and may be configured to transport substrates and/or semiconductor devices between the plurality of processing chambers, to transport substrates and/or semiconductor devices between a processing chamber and a buffer area, to transport substrates and/or semiconductor devices between a processing chamber and an interface tool such as an equipment front end module (EFEM), and/or to transport substrates and/or semiconductor devices between a processing chamber and a transport carrier (e.g., a front opening unified pod (FOUP)), among other examples. In some implementations, a wafer/die transport tool 114 may be included in a multi-chamber (or cluster) deposition tool 102, which may include a pre-clean processing chamber (e.g., for cleaning or removing oxides, oxidation, and/or other types of contamination or byproducts from a substrate and/or semiconductor device) and a plurality of types of deposition processing chambers (e.g., processing chambers for depositing different types of materials, processing chambers for performing different types of deposition operations). In these implementations, the wafer/die transport tool 114 is configured to transport substrates and/or semiconductor devices between the processing chambers of the etch tool 108 without breaking or removing a vacuum (or an at least partial vacuum) between the processing chambers and/or between processing operations in the etch tool 108, as described herein.

FIG. 1B is a diagram of an example etch tool 108 described herein. In particular, FIG. 1B is a cross-sectional view of the etch tool 108. The etch tool 108 may include a plasma etch tool, which may be a type of dry etch tool that uses plasma ions to etch or remove portions of a wafer or layers/structures formed thereon. In some implementations, the etch tool 108 is a plasma etch tool for etching metals on a wafer. In some implementations, the etch tool 108 is a decoupled plasma source (DPS) tool, an inductively coupled plasma (ICP) tool, a transformer coupled plasma (TCP) tool, or another type of plasma etch tool.

As shown in FIG. 1B, the etch tool 108 includes a processing chamber 116. The processing chamber 116 includes a chamber that is capable of being hermetically sealed so that the processing chamber 116 can be pressurized (e.g., to a vacuum or a partial vacuum). As further shown in FIG. 1B, the etch tool 108 includes a plasma supply system 118 that is configured to generate a plasma and provide or supply the plasma to the processing chamber 116.

As further shown in FIG. 1B, a chuck 120 is included in the processing chamber 116. The chuck 120 is configured to support and secure a semiconductor substrate 122 (e.g., a wafer) in the processing chamber 116. The chuck 120 includes an electrostatic chuck (e-chuck or ESC) or another type of chuck (e.g., a vacuum chuck) that is configured to hold and/or secure a semiconductor substrate 122 in the processing chamber 116 during processing (e.g., plasma etching) of the semiconductor substrate 122. In implementations in which the chuck 120 includes an electrostatic chuck, the chuck 120 is configured to generate an attracting force between the chuck 120 and the semiconductor substrate 122 based on a voltage applied to the chuck 120. The voltage may be provided from a power supply that provides a high bias voltage to the chuck 120. The attractive force may cause the semiconductor substrate 122 to be retained on and supported by the chuck 120.

The chuck 120 may be sized and shaped depending on a size and a shape of semiconductor substrate 122 to be processed in the etch tool 108. For example, the chuck 120 may be circular shaped and may support all or a portion of a semiconductor substrate 122 that is also circular. In some implementations, the chuck 120 is constructed of a material or materials that are resistant to abrasion and/or corrosion caused by materials used to generate the plasma, and that can generate the attractive force between the chuck 120 and a semiconductor substrate 122. For example, the chuck 120 may be constructed of a metal, such as aluminum, stainless steel, or another suitable material.

An edge ring 124 is included in the processing chamber 116. The edge ring 124 (also referred to as a focus ring or a single ring) includes a ring-shaped structure that is positioned around a portion of the chuck 120. The edge ring 124 is configured to focus a plasma in the processing chamber 116 toward the semiconductor substrate 122 on the chuck 120 by directing (or redirecting) at least a portion of the plasma toward the semiconductor substrate 122. In this way, the edge ring 124 may increase electrical and plasma fluid uniformity in the processing chamber 116. A high bias voltage may be applied to the edge ring 124 (e.g., from a power supply) so that the edge ring 124 provides the electrical and plasma uniformity. The edge ring 124 may be sized and shaped depending on a size and a shape of semiconductor substrate 122 to be processed in the etch tool 108. For example, the edge ring 124 may be circular shaped and may include an opening to enable the edge ring 124 to surround a semiconductor substrate 122 on the chuck 120. In some implementations, the edge ring 124 is constructed of a material or materials that are resistant to abrasion and/or corrosion caused by materials used to generate the plasma, and that can provide the electrical and plasma uniformity for a semiconductor substrate 122. For example, the edge ring 124 may be constructed of a metal, such as aluminum, stainless steel, and/or another suitable material.

During a plasma operation of a semiconductor substrate 122 in the etch tool 108, a voltage bias may be applied to semiconductor substrate 122 such that an electric field is generated between the semiconductor substrate 122 and a plasma in the processing chamber 116. The voltage bias may include a negative voltage bias, which results in an excess of positively charged ions in a layer of the plasma above the semiconductor substrate 122. This dense layer of positively charged ions is referred to as a sheath 126, which may also be referred to as a plasma sheath, an electrostatic sheath, or a Debye sheath.

The plasma supply system 118 may provide a gas 130 to the processing chamber 116. The plasma supply system 118 may provide the gas 130 to the processing chamber 116 through an inlet port 128 in a first side (e.g., a top side) of the processing chamber 116. The gas 130 is removed from the processing chamber 116 through an exhaust port 132 (or outlet port) at an opposing side (e.g., a bottom side) of the processing chamber 116. As an example, the plasma supply system 118 may, based on an etching recipe, provide the gas 130 at a flow rate that is included in a range of approximately 100 standard cubic centimeters per minute to approximately 2000 standard cubic centimeters per minute. However, other flow rates for the gas 130 are within the scope of the present disclosure.

The etch tool 108 includes a turbo vacuum pump 134 to facilitate the generation of a flow path of the gas 130 between the inlet port 128 and the exhaust port 132. For example, and as shown in the example in FIG. 2B, the flow path originates at the inlet port 128, the flow path expands outward in the processing chamber 116 and flows around the chuck 120 and the edge ring 124, and downward under the chuck 120 toward the exhaust port 132.

The turbo vacuum pump 134 may be further configured to control the pressure in the processing chamber 116 and to generate a vacuum (or partial vacuum) in the processing chamber 116. To generate the vacuum, the turbo vacuum pump 134 may include impellers rotating at a rotational velocity of approximately 22,000 revolutions per minute to approximately 27,000 revolutions per minute. However, other rotational velocities for the turbo vacuum pump 134 are within the scope of the present disclosure.

As further shown in FIG. 1B, the plasma supply system 118 includes an inner plasma source 136 and an outer plasma source 138. The inner plasma source 136 and the outer plasma source 138 include independently controllable plasma sources that, in combination, are configured to control and shape the plasma in the processing chamber 116. For example, the power, voltage, and/or other parameters may be independently configurable for inner plasma source 136 and the outer plasma source 138 to provide a plasma of the gas 130 to the processing chamber 116 such that the plasma includes a particular electric field distribution, a particular ion composition and/or distribution, such that the intensity of the plasma is greater in particular areas in the processing chamber 116 relative to other areas of the processing chamber 116, and/or the like.

The inner plasma source 136 and the outer plasma source 138 are respectively connected to radio frequency (RF) sources 140a and 140b. The RF source 140a and the RF source 140b may be referred to as a bias RF sources in that the RF source 140a and the RF source 140b are configured to provide or supply an RF or alternating current to the inner plasma source 136 and the outer plasma source 138, respectively, to bias the inner plasma source 136 and the outer plasma source 138. The inner plasma source 136 and/or the outer plasma source 138 may be biased to increase or decrease the strength of attraction of the ions in the plasma, which may be used to increase or decrease the etching rate (or etching rate distribution) for a semiconductor substrate 122. The RF source 140a and the RF source 140b may each be connected to an electrical ground and may each include RF power supply or another type of device that is capable of generating and providing/supplying an RF current in a suitable frequency range such as approximately 10 MHz to approximately 30 MHz or approximately 300 MHz to approximately 300 GHz, among other examples.

To generate the plasma, the RF sources 140a and 140b may provide RF or alternating current to the inner plasma source 136 and the outer plasma source 138, respectively.

The RF or alternating current may traverse through and/or along the coiled conductors of the inner plasma source 136 and the outer plasma source 138, which generates a time-varying electromagnetic field through electromagnetic induction. The time-varying electromagnetic field may create an electromotive force, which energizes the gas 130 into the processing chamber 116 with electrons, thereby forming the plasma.

Parameters associated with the RF sources 140a and 140b may vary. For example, in some implementations, a wattage associated with the RF sources 140a and 140b for one etching recipe may be in a range of approximately 30% to approximately 50% of a wattage for another etching recipe. As another example, a time duration associated with power generation by the RF sources 140a and 140b may be in a range of approximately 20 seconds for one etching recipe to approximately 50 seconds for another etching recipe. However, other values for wattage and time duration are within the scope of the present disclosure.

In some implementations, and as described in connection with FIGS. 2A and 2B, the etch tool 108 may include a flow-control subsystem 142 to improve a uniformity of the flow of the gas 130, and the plasma, across a surface of the semiconductor substrate. One or more components of the flow-control subsystem 142 may be between the chuck 120 and the exhaust port 132. The improved uniformity of the flow of the gas 130, and the plasma, may result in a more uniform etching rate across the surface of the semiconductor substrate 122 and reduce a likelihood of a clustering of particulates at or near edges of the semiconductor substrate 122.

An example implementation of the etch tool 108, as described in connection with FIGS. 2A-6 and elsewhere herein, may include the processing chamber 116 and the chuck 120 located within the processing chamber 116. In the implementations, the chuck 120 is configured to support the semiconductor substrate 122 during an etching operation. The etch tool 108 includes the inlet port 128 located above the chuck 120. The etch tool 108 includes the exhaust port 132 located at or near a central portion of the processing chamber 116 below the chuck. The etch tool 108 includes an impeller located at or near the central portion of the processing chamber 116 below the chuck 120. The impeller may be configured to improve a uniformity of the gas 130 flowing from the inlet port 128, across a surface of the semiconductor substrate 122, and through the exhaust port 132 to cause the etching operation to be substantially uniform.

The number and arrangement of devices shown in FIGS. 1A and 1B are provided as one or more examples. In practice, there may be additional devices, fewer devices, different devices, or differently arranged devices than those shown in FIGS. 1A and 1B. Furthermore, two or more devices shown in FIGS. 1A and 1B may be implemented within a single device, or a single device shown in FIGS. 1A and 1B may be implemented as multiple, distributed devices. Additionally, or alternatively, a set of devices (e.g., one or more devices) of the etch tool 108 or the flow-control subsystem 142 may perform one or more functions described as being performed by another set of devices of the etch tool 108 or the flow-control subsystem 142.

Figure 2C:
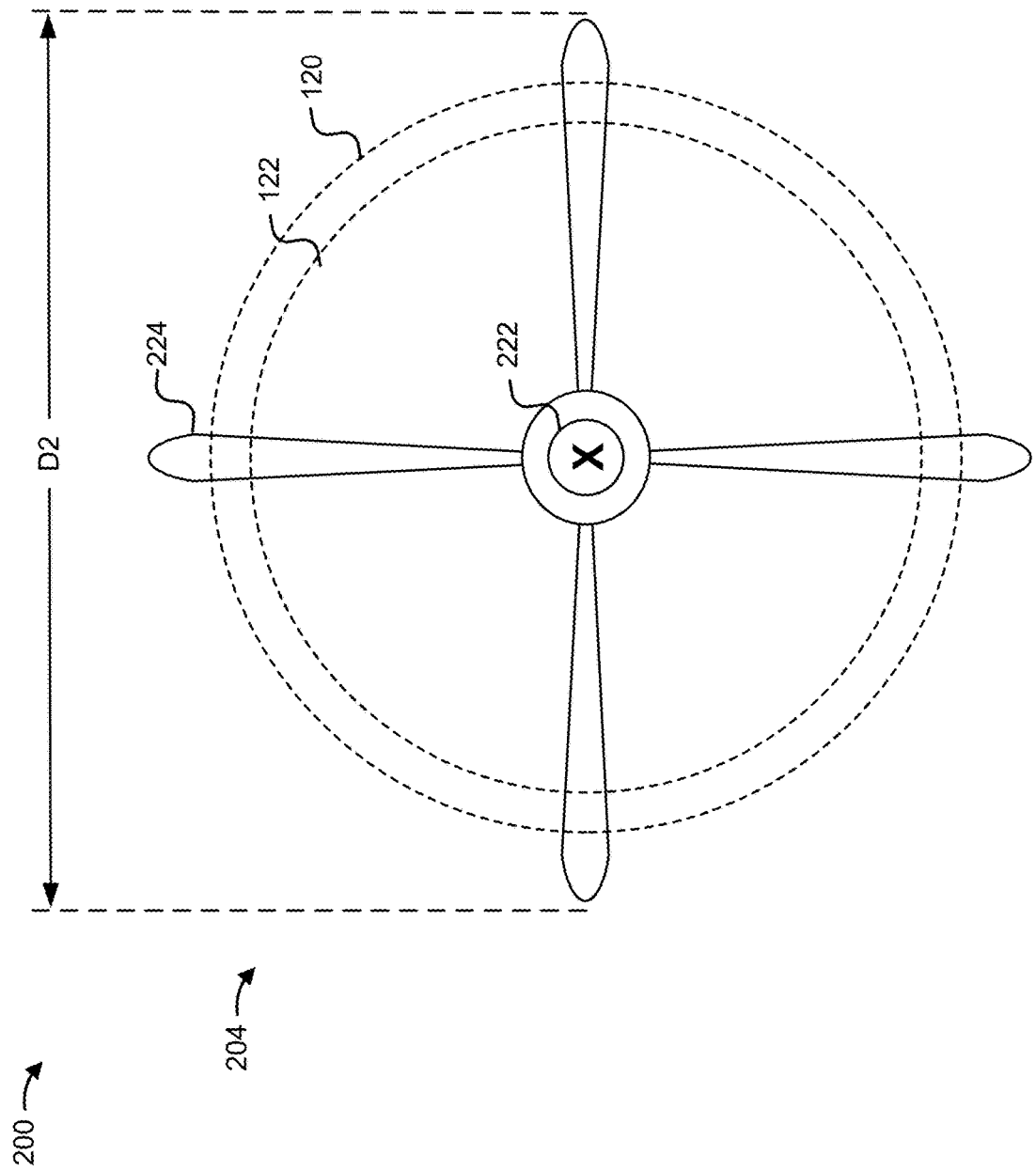

FIGS. 2A-2C are diagrams of an example implementation 200 of the flow-control subsystem 142 described herein. As shown in FIG. 2A, the flow-control subsystem 142 includes an impeller 202 (e.g., a rotary deflector, or one or more fan blades, among other examples). As described in connection with FIGS. 2B, 4A, 4B, and elsewhere herein, the impeller 202 may be configured to draw (e.g., propel) a flow of the gas 130 towards the exhaust port 132. In some implementations, the impeller 202 may include a stainless steel material, among other examples. However, other materials for the impeller 202 are within the scope of the present disclosure.

The impeller 202 may be mechanically coupled to a motor component 204. In some implementations, the motor component 204 includes a type of motor component that corresponds to a servo motor, among other examples. However, other types of motor components are within the scope of the present disclosure. The motor component 204 may be configured to rotate the impeller 202 at a rotational velocity included in a range of up to approximately 60 revolutions per minute. If the rotational velocity of the impeller 202 is greater than approximately 60 revolutions per minute, a flow rate of the gas 130 (e.g., a flow rate in standard cubic centimeters per minute) may exceed a target flow rate for an etching recipe within the etch tool 108. Additionally, or alternatively, if the rotational velocity of the impeller 202 is greater than approximately 60 revolutions per minute, particulates and/or contaminants within the etch tool 108 may become dislodged and contaminate the semiconductor substrate 122. However, other values and ranges for the rotational velocity of the impeller 202 are within the scope of the present disclosure.

The flow-control subsystem 142 further includes a thermal component 206. The thermal component 206 may include a temperature sensor 208. For example, the temperature sensor 208 may correspond to a thermocouple or a thermistor. In some implementations, the temperature sensor 208 is configured to provide temperature data and/or information to a controller. The thermal component 206 may further include a heat-transfer component 210. The heat-transfer component 210 may generate and transfer an amount of heat 212 (e.g., an amount of heat in Joules) using a conduction heat-transfer component (e.g., an electrically resistive heater), a radiation heat-transfer component (e.g., an infrared heater), or a convection heat-transfer component (e.g., heated fan), among other examples.

The heat-transfer component 210 may be configured to transfer portions of the amount of heat 212 at varying rates (e.g., varying rates in watts) to the impeller 202 and/or the exhaust port 132. Additionally, or alternatively, the heat-transfer component 210 may be configured to transfer portions of the amount of heat 212 to a region of the processing chamber 116 surrounding the impeller 202 and/or the exhaust port 132.

In some implementations, one or more features of the thermal component 206 (e.g., the temperature sensor 208 and/or the heat-transfer component 210) may be located near the impeller 202 and/or the exhaust port 132 (e.g., within the processing chamber 116). The thermal component 206 may be configured to maintain a temperature of the impeller 202, the exhaust port 132, and/or the region (e.g., the region surrounding the impeller and/or the exhaust port) at a temperature that is included in a range of approximately 50° C. to approximately 130° C. By the thermal component 206 maintaining the temperature of the impeller 202, the exhaust port 132, and/or the region within this range, a temperature of the gas 130 may be stabilized to achieve a desired performance of an etching recipe within the etch tool 108.

For example, if the temperature of the impeller, the exhaust port, or the region is less than approximately 50° C., a density of the gas 130 may be increased (through cooling) to reduce a uniformity of a flow of the gas 130 and cause a reduction in a uniformity of an etching rate across a semiconductor substrate (e.g., the semiconductor substrate 122) If the temperature is greater than approximately 130° C., damage may occur to the impeller 202 and/or other portions of the etch tool 108.

The flow-control subsystem 142 includes a controller 214 (e.g., a processor, a combination of a processor and memory, among other examples). The controller 214 may operate the flow-control subsystem 142 using a machine learning model. The machine learning model may include and/or may be associated with one or more of a neural network, a random forest model, a clustering model, or a regression model, among other examples. In some implementations, the controller 214 uses the machine learning model to determine a setting of the motor component 204 or a setting of the thermal component 206 by providing candidate rotational velocity, temperature, or heat-transfer parameters as input to the machine learning model, and using the machine learning model to determine a likelihood, probability, or confidence that a particular outcome (e.g., a rate of flow of the gas 130 or an etching rate across the semiconductor substrate 122) for a subsequent etching operation will be achieved using the candidate parameters.

The controller 214 (or another system) may train, update, and/or refine the machine learning model to increase the accuracy of the outcomes and/or parameters determined using the machine learning model. The controller 214 may train, update, and/or refine the machine learning model based on feedback and/or results from the subsequent etching recipes, as well as from historical or related etching uniformities, dispersions of particulates, or yields of semiconductor products measured across populations of semiconductor substrates processed through the etch tool 108.

In some implementations, the controller 214 communicates with the motor component 204 and/or the thermal component 206 using one or more communication links 216 (e.g., one or more wireless-communication links, one or more wired-communication links, or a combination of a wireless-communication link and a wired-communication link, among other examples). Using the one or more communication links 216, the controller 214 may exchange signals (e.g., signals carrying commands, information, or data content, among other examples). The signals may include individual signals, combinations or sequences of signals, analog signals, digital signals, digital communications, and/or other types of signals.

The controller 214 may also communicate with a user interface 218 (e.g., a graphical user interface) using the one or more communication links 216. In some implementations, the user interface 218 corresponds to a user interface of the etch tool 108 (or a portion of the user interface of the etch tool 108). In some implementations, the user interface 218 is a standalone user interface that is dedicated to the flow-control subsystem 142. A user of the etch tool 108 (e.g., an operator or an engineer, among other examples) may provide commands to the controller 214 through the user interface 218.

The controller 214 may include different arrangements, portions, or configurations. For example, in some implementations the controller 214 is arranged as a controller of the etch tool 108. In some implementations, the controller 214 is configured to include a motor component controller portion and a temperature controller portion. In some implementations, the controller 214 is separate from the etch tool 108 and is dedicated to the flow-control subsystem 142. Additionally, or alternatively, portions of the controller 214 may be divided across multiple controllers that are part of the etch tool 108 or separate from the etch tool 108.

The controller 214 may communicate with a notification system 220 using the one or more communication links 216. The notification system 220 may include a visual component (e.g., a status indicator light or a graphical user interface, among other examples) and/or an audio component (e.g., a speaker or a buzzer, among other examples). The notification system 220 may indicate, to a maintenance engineer and/or an operator of the etch tool 108, a status of the flow-control subsystem 142 (e.g., the flow-control subsystem 142 is active, among other examples).

In an example implementation, the flow-control subsystem 142 includes the impeller 202 positioned above the exhaust port 132. The exhaust port 132 is centrally located below the chuck 120 within the processing chamber 116 associated with the etch tool 108. The flow-control subsystem 142 includes the motor component 204 and the thermal component 206. The thermal component 206 may be configured to be positioned at or near the impeller 202, the exhaust port 132, and/or a region of the processing chamber 116 that surrounds the impeller 202 and the exhaust port 132. The flow-control subsystem 142 includes the controller 214. The controller 214 may be configured to determine, based on an etching recipe, a first setting for the motor component 204 and a second setting for the thermal component 206. The controller 214 is configured provide, to the motor component 204, the first setting to cause the motor component 204 to rotate the impeller 202 at a rotational velocity corresponding to the first setting. The controller 214 is configured to provide, to the thermal component 206, the second setting to cause the thermal component 206 to maintain the impeller 202, the exhaust port 132, and/or the region to a temperature corresponding to the second setting.

In another example implementation, the controller 214 performs a method. The method includes receiving, by the controller 214 of the flow-control subsystem 142, an indication of a plasma-based etching operation commencing in the processing chamber 116. The flow-control subsystem 142 may include the impeller 202 located below the chuck 120 within the processing chamber 116 and above the exhaust port 132 exiting the processing chamber 116. The method includes determining, by the controller 214, a setting of a motor component 204. The motor component 204 may be mechanically coupled to the impeller 202. The method includes transmitting, by the controller 214 to the motor component 204, a signal to cause the motor component 204 to rotate the impeller 202 at a rotational velocity corresponding to the setting of the motor component 204.

FIG. 2B shows example details of the exhaust port 132 and the impeller 202. As shown in FIG. 2B, the exhaust port 132 is located at or near a central portion of the processing chamber 116 below the chuck 120. Furthermore, the impeller 202 is at or near the central portion of the processing chamber below the chuck 120. As shown in FIG. 2B, the chuck 120, the exhaust port 132, and the impeller 202 share a central axis 222 (e.g., the central axis 222 corresponds to a shared central axis). In comparison to a configuration of the processing chamber 116 that may have the exhaust port 132 located at an edge of the processing chamber 116 (not shown), the configuration of the centralized exhaust port 132 (and the impeller 202) as shown in FIG. 2B may improve a uniformity of the gas 130 flowing from the inlet port 128, across a surface of the semiconductor substrate 122, and through the exhaust port 132 to cause an etching operation to the surface of the semiconductor substrate 122 to be substantially uniform. The thermal component 206 (omitted from FIG. 2B for clarity purposes) may further improve the uniformity of the flow of the gas 130 across the semiconductor substrate In some implementations, a diameter D1 of the exhaust port 132 is included in a range of approximately 63.5 millimeters to approximately 152.4 millimeters. If the diameter D1 is less than approximately 63.5 millimeters, the exhaust port 132 may be throttled and not able to satisfy a flow rate threshold (e.g., a lower threshold) associated with an etching recipe, and cause etching uniformity issues. If the diameter D1 is greater than approximately 152.4 millimeters, the exhaust port 132 may be oversized and not satisfy another flow rate threshold (e.g., an upper threshold) associated with the etching recipe, and reduce the etching uniformity. However, other values and ranges for the diameter D1 are within the scope of the present disclosure.

FIG. 2C shows additional details of the impeller 202. The view of FIG. 2C corresponds to a top view showing a footprint of the impeller 202 in relation to a footprint of the chuck 120 and a footprint of the semiconductor substrate 122 (shown using dashed lines). In some implementations, the impeller 202 shares the central axis 222 with the chuck 120, the semiconductor substrate 122, and the exhaust port 132.

Although shown with a quantity of four blades 224, the impeller 202 may include a greater quantity of the blades 224 or a lesser quantity of the blades 224. Additionally, or alternatively, the impeller 202 may include deflectors, perforations, or other mechanical features that may guide and/or propel a flow of the gas 130 during rotation of the impeller 202.

The impeller 202 may include a diameter D2 that is included in a range of approximately 450 millimeters to approximately 550 millimeters. If the diameter D2 is less than approximately 450 millimeters, the impeller 202 may have a negligible impact on improving the uniformity of flow of the gas 130 across the surface of the semiconductor substrate 122 and/or a negligible impact on improving the uniformity of the etching rate across the surface of the semiconductor substrate 122. If the diameter is greater than approximately 550 millimeters, the impeller 202 may not be mechanically compatible with the processing chamber 116. However, other values and ranges for the diameter D2 of the impeller 202 are within the scope of the present disclosure.

The number and arrangement of devices shown in FIGS. 2A-2C are provided as one or more examples. In practice, there may be additional devices, fewer devices, different devices, or differently arranged devices than those shown in FIGS. 2A-2C. Furthermore, two or more devices shown in FIGS. 2A-2C may be implemented within a single device, or a single device shown in FIGS. 2A-2C may be implemented as multiple, distributed devices. Additionally, or alternatively, a set of devices (e.g., one or more devices) of the flow-control subsystem 142 may perform one or more functions described as being performed by another set of devices of the flow-control subsystem 142.

Figure 3A:
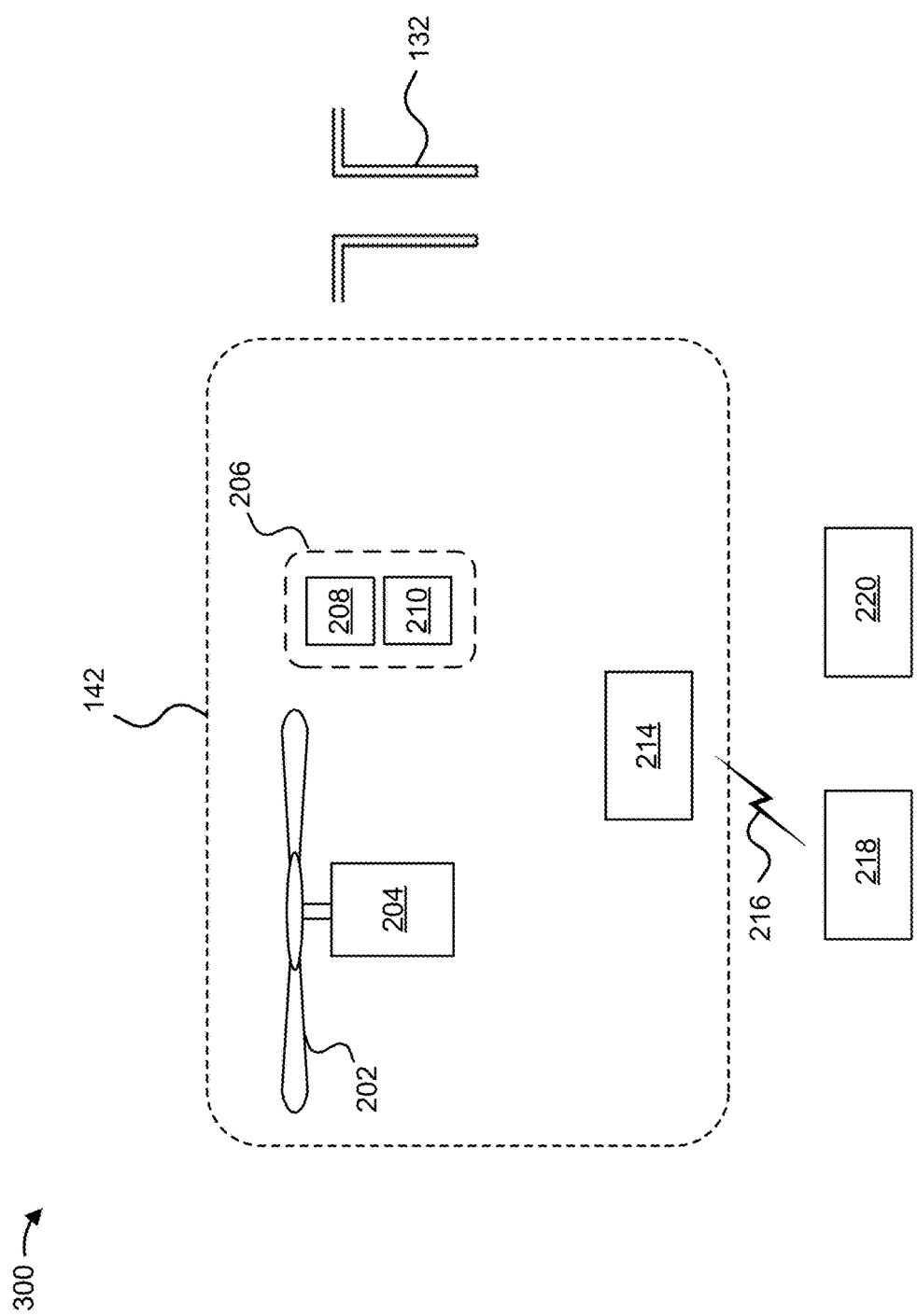
Figure 3C:
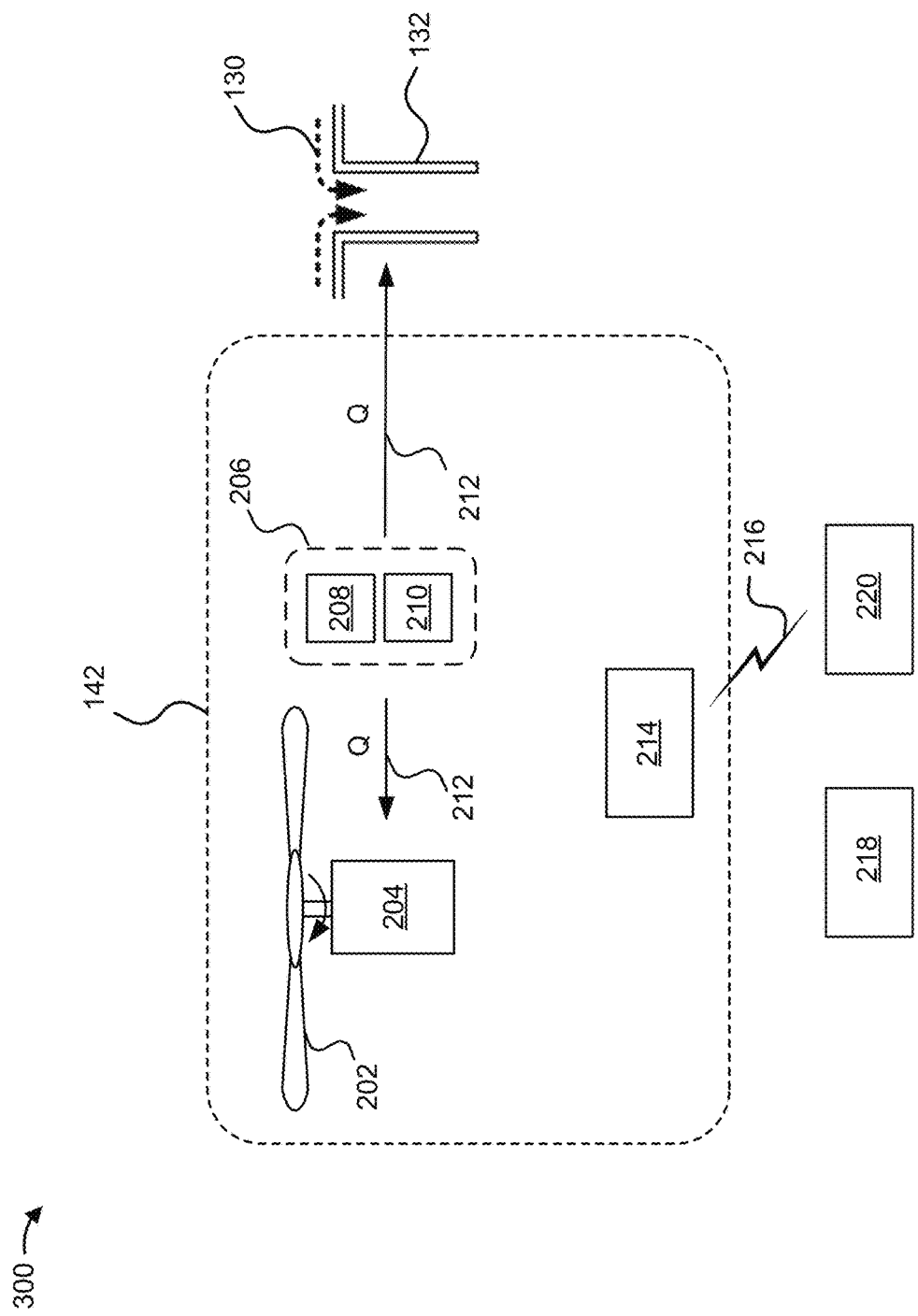

FIGS. 3A-3C are diagrams of an example implementation 300 described herein. FIG. 3A shows an example signal being received by the controller 214 using one or more of the communication links 216. In some implementations, the signal includes a command to initiate operation of the flow-control subsystem 142 as part of an etching operation commencing. In some implementations, the signal includes information or data related to an etching recipe (e.g., information or data related to a temperature within the processing chamber 116, information or data related to a flow rate of the gas 130 within the processing chamber 116, or information or data related to a pressure within the processing chamber 116, among other examples). In some implementations, the signal may be received from the user interface 218. Additionally, or alternatively, the signal may be received from sensors in the processing chamber 116 that detect a flow of the gas 130, sensors that detect a presence of the semiconductor substrate 122 on the chuck 120, or a timer, among other examples. The controller 214 may determine, based on the information or data, a setting for the motor component 204 and/or a setting for the thermal component 206. In some implementations, the controller 214 uses the machine learning model to determine the settings.

FIG. 3B shows the controller 214 transmitting a signal to the motor component 204 and a signal to thermal component 206 using the one or more communication links 216. In some implementations, the signal to the motor component 204 may include the rotational velocity of the impeller 202 corresponding to the setting for the motor component 204. In response, the motor component 204 may rotate the impeller 202 at the rotational velocity. As shown in FIG. 3B, the flow of the gas 130 has been initiated as part of the etching operation.

In some implementations, the signal to the thermal component 206 may include the temperature corresponding to the setting of the thermal component 206. In response, the thermal component 206 may maintain the exhaust port 132, the impeller 202, and or the region of the processing chamber surrounding the exhaust port 132 and the impeller 202 to the temperature. As shown in FIG. 3B, the heat-transfer component 210 generates and transfers portions of the heat 212 to the exhaust port 132, the impeller 202, and or the region of the processing chamber surrounding the exhaust port 132 and the impeller 202. In some implementations, the temperature of the exhaust port 132, the impeller 202, and the region coincides with a temperature of the gas 130. In some implementations, the temperature sensor 208 provides information and/or data (e.g., information and/or data corresponding to a temperature) to the heat-transfer component 210. Additionally, or alternatively, the temperature sensor 208 may provide the information and/or data to the controller 214.

FIG. 3C shows the controller 214 transmitting a signal to the notification system 220. The signal to the notification system 220 may be to cause the notification system 220 to indicate to a user of the flow-control subsystem 142 (and/or the etch tool 108) that the flow-control subsystem 142 is active. In some implementations, the signal to the notification system 220 may cause the notification system 220 to provide (e.g., display) one or more parameters (e.g., the rotational velocity of the impeller 202 or a temperature detected by the temperature sensor 208, among other examples) associated with the etching operation. Additionally, or alternatively, the controller 214 may transmit a signal (e.g., a push message) to a user's device (e.g., a tablet, a phone) with similar information.

As indicated above, FIGS. 3A-3C are provided as examples. Other examples may differ from what is described with regard to FIGS. 3A-3C.

Figure 4A:
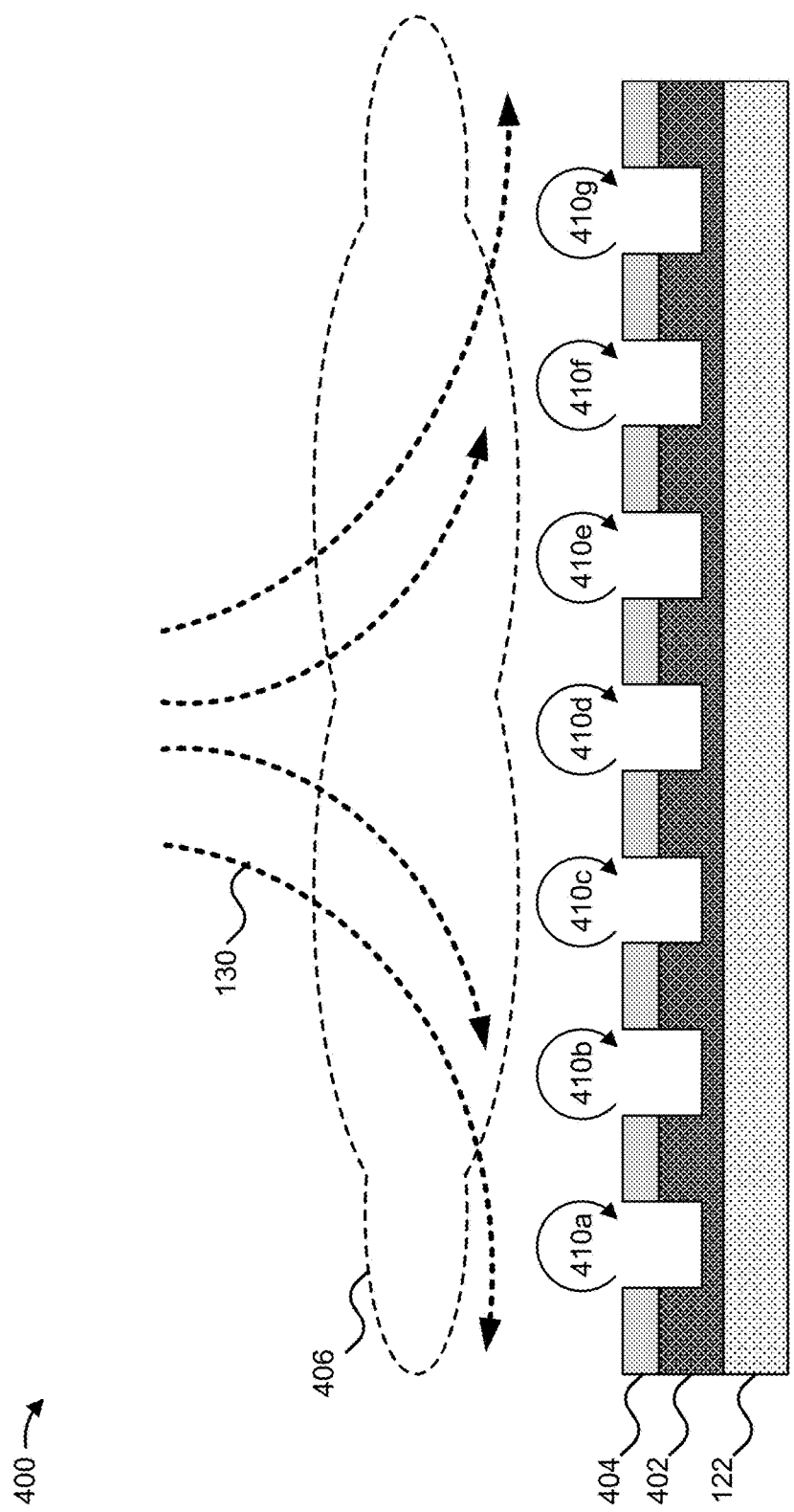
FIGS. 4A and 4B are diagrams of an example implementation of an etch tool including a flow-control subsystem described herein.
Figure 4B:
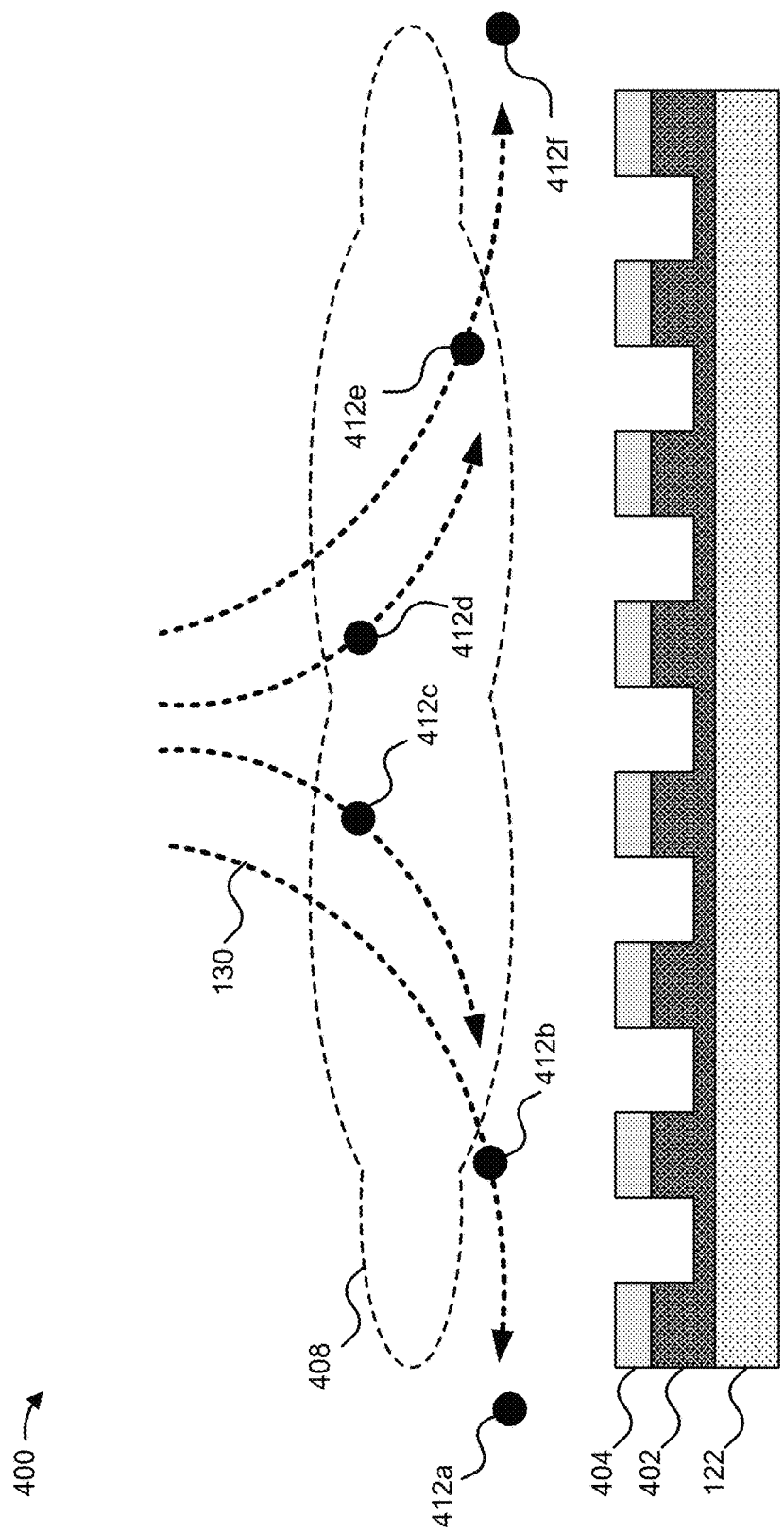

FIGS. 4A and 4B are diagrams of an example implementation 400 of the etch tool 108 including the flow-control subsystem 142 described herein. FIG. 4A shows an example etching operation performed on the semiconductor substrate 122. As shown, the semiconductor substrate 122 includes a layer of a semiconductor material 402 (e.g., silicon dioxide or $SiO_2$, among other examples) undergoing the etching operation. A layer of a photoresist material 404 is patterned (e.g., deposited, exposed, and developed using a photolithography operation) over the layer of the semiconductor material 402.

In FIG. 4A, the flow-control subsystem 142 may be active to improve the uniformity of the flow of the gas 130 across the surface of the semiconductor substrate 122 (e.g., across the layer of the photoresist material 404 patterned over the layer of the semiconductor material 402). Additionally, or alternatively, the flow-control subsystem 142 may improve a uniformity (e.g., distribution) of a plasma 406 formed over the surface of the semiconductor substrate 122 as part of the etching operation.

As a result of the improved uniformity of the flow of the gas 130 and/or the plasma 406, etching rates across the semiconductor substrate 122 (e.g., the etching rates 410a-410g) may be substantially uniform. As an example, and using the flow-control subsystem 142, the etching rates 410a-410g may include a mean of approximately 695 angstroms per minute, a three-sigma standard deviation of approximately 51 angstroms per minute, and a range of approximately 69 angstroms per minute. In contrast, etching rates not using the flow-control subsystem 142 may include a mean of approximately 710 angstroms per minute, a three-sigma standard deviation of approximately 62 angstroms per minute, and a range of approximately 75 angstroms per minute. Such an improvement in the uniformity of the etching rate may provide better control to etch features of integrated circuitry and improve a yield of semiconductor product formed on the semiconductor substrate 122.

As shown in FIG. 4B, the improved uniformity of the flow of the gas 130 may reduce a likelihood of particulates from forming on the semiconductor substrate 122. As shown in FIG. 4B, particulates 412a-412f are carried by the gas 130 away from surfaces of the semiconductor substrate 122 (e.g., including the layer of the semiconductor material 402 and the layer of the photoresist material 404). In some implementations, the improved uniformity of the flow of the gas 130 prevents the particulates 412a-412f from clustering at or near edges of the semiconductor substrate 122 to reduce a defect density at or near the edges of the semiconductor substrate 122. Such a reduction in the defect density may improve a yield of semiconductor product formed on the semiconductor substrate 122.

FIG. 5 is a diagram of example components of a device 500, which may correspond to the etch tool 108, the flow-control subsystem 142, and/or the controller 214. In some implementations, the etch tool 108, the flow-control subsystem 142, and/or the controller 214 include one or more devices 500 and/or one or more components of device 500. As shown in FIG. 5, device 500 may include a bus 510, a processor 520, a memory 530, an input component 540, an output component 550, and a communication component 560.

Bus 510 includes one or more components that enable wired and/or wireless communication among the components of device 500. Bus 510 may couple together two or more components of FIG. 4, such as via operative coupling, communicative coupling, electronic coupling, and/or electric coupling. Processor 520 includes a central processing unit, a graphics processing unit, a microprocessor, a controller, a microcontroller, a digital signal processor, a field-programmable gate array, an application-specific integrated circuit, and/or another type of processing component. Processor 520 is implemented in hardware, firmware, or a combination of hardware and software. In some implementations, processor 520 includes one or more processors capable of being programmed to perform one or more operations or processes described elsewhere herein.

Memory 530 includes volatile and/or nonvolatile memory. For example, memory 530 may include random access memory (RAM), read only memory (ROM), a hard disk drive, and/or another type of memory (e.g., a flash memory, a magnetic memory, and/or an optical memory). Memory 530 may include internal memory (e.g., RAM, ROM, or a hard disk drive) and/or removable memory (e.g., removable via a universal serial bus connection). Memory 530 may be a non-transitory computer-readable medium. Memory 530 stores information, instructions, and/or software (e.g., one or more software applications) related to the operation of device 500. In some implementations, memory 530 includes one or more memories that are coupled to one or more processors (e.g., processor 520), such as via bus 510.

Input component 540 enables device 500 to receive input, such as user input and/or sensed input. For example, input component 540 may include a touch screen, a keyboard, a keypad, a mouse, a button, a microphone, a switch, a sensor, a global positioning system sensor, an accelerometer, a gyroscope, and/or an actuator. Output component 550 enables device 500 to provide output, such as via a display, a speaker, and/or a light-emitting diode. Communication component 560 enables device 500 to communicate with other devices via a wired connection and/or a wireless connection. For example, communication component 560 may include a receiver, a transmitter, a transceiver, a modem, a network interface card, and/or an antenna.

Device 500 may perform one or more operations or processes described herein. For example, a non-transitory computer-readable medium (e.g., memory 530) may store a set of instructions (e.g., one or more instructions or code) for execution by processor 520. Processor 520 may execute the set of instructions to perform one or more operations or processes described herein. In some implementations, execution of the set of instructions, by one or more processors 520, causes the one or more processors 520 and/or the device 500 to perform one or more operations or processes described herein. In some implementations, hardwired circuitry is used instead of or in combination with the instructions to perform one or more operations or processes described herein. Additionally, or alternatively, processor 520 may be configured to perform one or more operations or processes described herein. Thus, implementations described herein are not limited to any specific combination of hardware circuitry and software.

The number and arrangement of components shown in FIG. 5 are provided as an example. Device 500 may include additional components, fewer components, different components, or differently arranged components than those shown in FIG. 5. Additionally, or alternatively, a set of components (e.g., one or more components) of device 500 may perform one or more functions described as being performed by another set of components of device 500.

Figure 6:
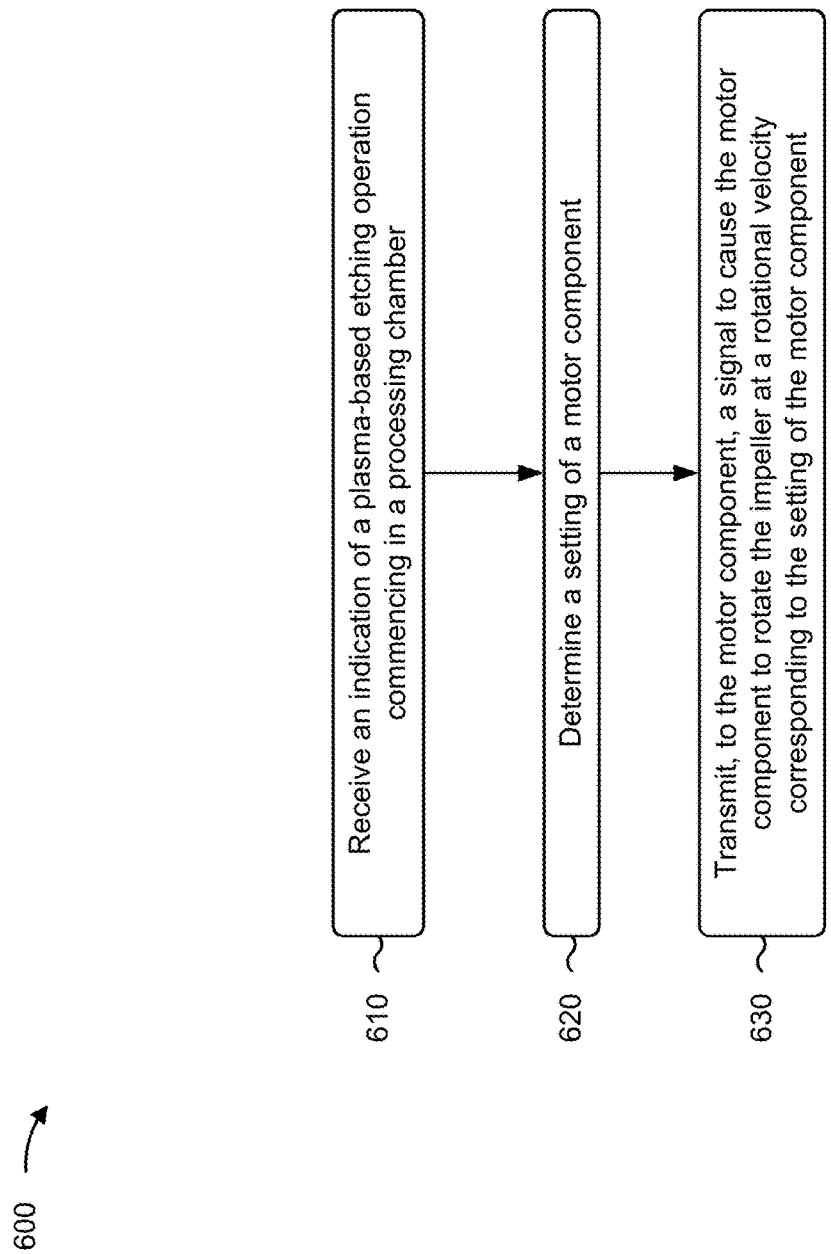
FIGS. 6 and 7 are flowcharts of example processes associated with a flow-control subsystem described herein.

FIG. 6 is a flowchart of an example process 600 associated with semiconductor tool and methods of operation. In some implementations, one or more process blocks of FIG. 6 are performed by the controller 214. In some implementations, one or more process blocks of FIG. 6 are performed by another device or a group of devices separate from or including the controller 214, such as the etch tool 108, the motor component 204, the thermal component 206, the user interface 218, or the notification system 220. Additionally, or alternatively, one or more process blocks of FIG. 6 may be performed by one or more components of device 500, such as processor 520, memory 530, input component 540, output component 550, and/or communication component 560.

As shown in FIG. 6, process 600 may include receiving an indication of a plasma-based etching operation commencing in a processing chamber, wherein the flow-control subsystem includes an impeller located below a chuck within the processing chamber and above an exhaust port exiting the processing chamber (block 610). For example, the controller 214 of the flow-control subsystem 142 may receive an indication of a plasma-based etching operation commencing in a processing chamber 116, as described above. In some implementations, the flow-control subsystem 142 includes an impeller 202 located below a chuck 120 within the processing chamber 116 and above an exhaust port 132 exiting the processing chamber.

As further shown in FIG. 6, process 600 may include determining a setting of a motor component, wherein the motor component is mechanically coupled to the impeller (block 620). For example, the controller 214 may determine a setting of a motor component 204, as described above. In some implementations, the motor component 204 is mechanically coupled to the impeller 202.

As further shown in FIG. 6, process 600 may include transmitting a signal to cause the motor component to rotate the impeller at a rotational velocity corresponding to the setting of the motor component (block 630). For example, the controller 214 may transmit a signal to cause the motor component 204 to rotate the impeller 202 at a rotational velocity corresponding to the setting of the motor component 204, as described above.

Process 600 may include additional implementations, such as any single implementation or any combination of implementations described below and/or in connection with one or more other processes described elsewhere herein.

In a first implementation, determining the setting of the motor component 204 is based, at least in part, on an etching recipe associated with the plasma-based etching operation.

In a second implementation, alone or in combination with the first implementation, determining the setting of the motor component 204 is based, at least in part, on a machine learning model that correlates the rotational velocity to one or more historical operating conditions. In some implementations, one or more historical operating conditions include at least one of an etching uniformity across a population of semiconductor substrates, a dispersion of particulates across the population of semiconductor substrates, or a yield of semiconductor product from the population of semiconductor substrates.

In a third implementation, alone or in combination with one or more of the first and second implementations, process 600 includes determining, by the controller 214, a setting of a thermal component 206. In some implementations, the thermal component 206 is associated with the impeller 202, the exhaust port 132, and/or a region surrounding the impeller 202 and the exhaust port 132. The process 600 includes transmitting, by the controller 214 to the thermal component 206, a signal to cause the thermal component 206 to maintain the impeller 202, the exhaust port 132, and/or the region to an temperature corresponding to the setting of the thermal component 206.

In a fourth implementation, alone or in combination with one or more of the first through third implementations, determining the setting of the thermal component 206 is based, at least in part, on an etching recipe associated with the plasma-based etching operation.

In a fifth implementation, alone or in combination with one or more of the first through fourth implementations, determining the setting of the thermal component 206 is based, at least in part, on a machine learning model that correlates the thermal setting to one or more historical operating conditions. In some implementations, the one or more historical operating conditions include at least one of an etching uniformity across a population of semiconductor substrates, a dispersion of particulates across the population of semiconductor substrates, or a yield of semiconductor product from the population of semiconductor substrates.

In a sixth implementation, alone or in combination with one or more of the first through fifth implementations, process 600 includes transmitting, by the controller 214 to a notification system 220, a signal to cause the notification system 220 to indicate that the flow-control subsystem 142 is active.

Although FIG. 6 shows example blocks of process 600, in some implementations, process 600 includes additional blocks, fewer blocks, different blocks, or differently arranged blocks than those depicted in FIG. 6. Additionally, or alternatively, two or more of the blocks of process 600 may be performed in parallel.

Figure 7:
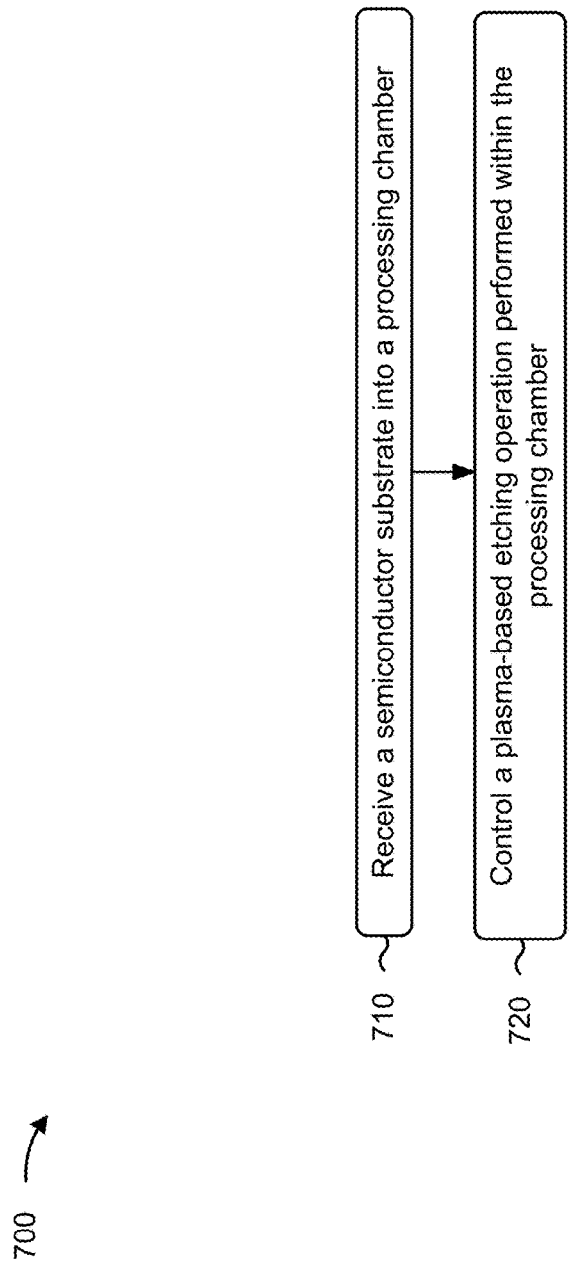

FIG. 7 is a flowchart of an example process 700 associated with semiconductor tool and methods of operation. In some implementations, one or more process blocks of FIG. 7 are performed by the controller 214. In some implementations, one or more process blocks of FIG. 7 are performed by another device or a group of devices separate from or including the controller 214, such as the etch tool 108, the motor component 204, the thermal component 206, the user interface 218, or the notification system 220. Additionally, or alternatively, one or more process blocks of FIG. 7 may be performed by one or more components of device 500, such as processor 520, memory 530, input component 540, output component 550, and/or communication component 560.

As shown in FIG. 7, process 700 may include receiving a semiconductor substrate into a processing chamber (block 710). For example, the etch tool 108 may receive a semiconductor substrate 122 into a processing chamber 116, as described above.

As further shown in FIG. 7, process 700 may include controlling a plasma-based etching operation performed within the processing chamber (block 720). For example, the controller 214 of a flow-control subsystem 142 may control a plasma-based etching operation performed within the processing chamber 116, as described above.

In some implementations, performing the plasma-based etching operation includes receiving, by the controller 214 of the flow-control subsystem 142, an indication of the plasma-based etching operation commencing in the processing chamber 116, where the flow-control subsystem 142 includes an impeller 202 located below a chuck 120 within the processing chamber 116 and above an exhaust port 132 exiting the processing chamber 116. The plasma-based etching operation may include determining, by the controller 214, a setting of a motor component 204, where the motor component 204 is mechanically coupled to the impeller 202. The plasma-based etching operation may include transmitting, by the controller 214 to the motor component 204, a signal to cause the motor component 204 to rotate the impeller 202 at a rotational velocity corresponding to the setting of the motor component 204.

Process 700 may include additional implementations, such as any single implementation or any combination of implementations described below and/or in connection with one or more other processes described elsewhere herein.

In a first implementation, determining the setting of the motor component 204 is based, at least in part, on an etching recipe associated with the plasma-based etching operation.

In a second implementation, alone or in combination with the first implementation, determining the setting of the motor component 204 is based, at least in part, on a machine learning model that correlates the rotational velocity to one or more historical operating conditions. In some implementations, one or more historical operating conditions include at least one of an etching uniformity across a population of semiconductor substrates, a dispersion of particulates across the population of semiconductor substrates, or a yield of semiconductor product from the population of semiconductor substrates.

In a third implementation, alone or in combination with one or more of the first and second implementations, process 700 includes determining, by the controller 214, a setting of a thermal component 206. In some implementations, the thermal component 206 is associated with the impeller 202, the exhaust port 132, and/or a region surrounding the impeller 202 and the exhaust port 132. The process 700 includes transmitting, by the controller 214 to the thermal component 206, a signal to cause the thermal component 206 to maintain the impeller 202, the exhaust port 132, and/or the region to an temperature corresponding to the setting of the thermal component 206.

In a fourth implementation, alone or in combination with one or more of the first through third implementations, determining the setting of the thermal component 206 is based, at least in part, on an etching recipe associated with the plasma-based etching operation.

In a fifth implementation, alone or in combination with one or more of the first through fourth implementations, determining the setting of the thermal component 206 is based, at least in part, on a machine learning model that correlates the thermal setting to one or more historical operating conditions. In some implementations, the one or more historical operating conditions include at least one of an etching uniformity across a population of semiconductor substrates, a dispersion of particulates across the population of semiconductor substrates, or a yield of semiconductor product from the population of semiconductor substrates.

In a sixth implementation, alone or in combination with one or more of the first through fifth implementations, process 700 includes transmitting, by the controller 214 to a notification system 220, a signal to cause the notification system 220 to indicate that the flow-control subsystem 142 is active.

Although FIG. 7 shows example blocks of process 700, in some implementations, process 700 includes additional blocks, fewer blocks, different blocks, or differently arranged blocks than those depicted in FIG. 7. Additionally, or alternatively, two or more of the blocks of process 700 may be performed in parallel.

Some implementations described herein provide techniques and apparatuses for improving a uniformity of a flow of a gas across a semiconductor substrate in an etch tool. The etch tool includes flow-control subsystem and a exhaust port located at a bottom center of a chamber of the etch tool. The flow-control subsystem includes an impeller and a thermal component. By varying a rotational velocity of the impeller, and/or an amount of heat transferred from the thermal component, the uniformity of the flow of the gas across the semiconductor substrate may be improved.

In this way, an etching rate may be substantially uniform and contamination defects due to a clustering of particulates may be decreased, resulting in an increase in a yield of semiconductor product fabricated using the etch tool. Furthermore, the substantially uniform etching rate may reduce an amount of time that the etch tool is operated to reduce a use of processing resources within the etch tool.

As described in greater detail above, some implementations described herein provide an etch tool. The etch tool includes a processing chamber. The etch tool includes a chuck located within the processing chamber, where the chuck is configured to support a semiconductor wafer during an etching operation. The etch tool includes an inlet port located above the chuck. The etch tool includes an exhaust port located at or near a central portion of the processing chamber below the chuck. The etch tool includes an impeller located at or near the central portion of the processing chamber below the chuck, where the impeller is configured to improve a uniformity of a gas flowing from the inlet port, across a surface of the semiconductor substrate, and through the exhaust port to cause the etching operation to be substantially uniform.

As described in greater detail above, some implementations described herein provide a flow-control subsystem. The flow-control subsystem includes an impeller, where the impeller is configured to be positioned above an exhaust port centrally located below a chuck within a processing chamber, and where the processing chamber is associated with an etch tool. The flow-control subsystem includes a motor component. The flow-control subsystem includes a thermal component, where the thermal component is configured to be positioned at or near the impeller, the exhaust port, and/or a region of the processing chamber surrounding the impeller and the exhaust port. The flow-control subsystem includes a controller configured, determine, based on an etching recipe, a first setting for the motor component and a second setting for the thermal component. The controller is configured to provide, to the motor component, the first setting to cause the motor component to rotate the impeller at a rotational velocity corresponding to the first setting and provide, to the thermal component, the second setting to cause the thermal component to maintain the impeller, the exhaust port, and/or the region to a temperature corresponding to the second setting.

As described in greater detail above, some implementations described herein provide a method. The method includes receiving a semiconductor substrate into a processing chamber and controlling a plasma-based etching operation performed within the processing chamber. In some implementations, controlling the plasma-based etching operation includes receiving, by a controller of a flow-control subsystem, an indication of the plasma-based etching operation commencing in the processing chamber, where the flow-control subsystem includes an impeller located below a chuck within the processing chamber and above an exhaust port exiting the processing chamber. The method may include determining, by the controller, a setting of a motor component, where the motor component is mechanically coupled to the impeller. The method may further include transmitting, by the controller to the motor component, a signal to cause the motor component to rotate the impeller at a rotational velocity corresponding to the setting of the motor component.

As used herein, "satisfying a threshold" may, depending on the context, refer to a value being greater than the threshold, greater than or equal to the threshold, less than the threshold, less than or equal to the threshold, equal to the threshold, not equal to the threshold, or the like.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
receiving a semiconductor substrate into a processing chamber; and
controlling a plasma-based etching operation performed within the processing chamber, wherein performing the plasma-based etching operation comprises:
receiving, by a controller of a flow-control subsystem, an indication of the plasma-based etching operation commencing in the processing chamber,
wherein the flow-control subsystem includes an impeller located below a chuck within the processing chamber and above an exhaust port exiting the processing chamber, and
wherein the chuck, the exhaust port, and the impeller share a central axis;
determining, by the controller, a setting of a motor component,
wherein the motor component is mechanically coupled to the impeller; and
transmitting, by the controller to the motor component, a signal to cause the motor component to rotate the impeller at a rotational velocity corresponding to the setting of the motor component.

2. The method of claim 1, wherein determining the setting of the motor component is based, at least in part, on an etching recipe associated with the plasma-based etching operation.

3. The method of claim 1, wherein determining the setting of the motor component is based, at least in part, on a machine learning model that correlates the rotational velocity to one or more historical operating conditions,
wherein the one or more historical operating conditions comprise at least one of:
an etching uniformity across a population of semiconductor substrates,
a dispersion of particulates across the population of semiconductor substrates, or
a yield of semiconductor product from the population of semiconductor substrates.

4. The method of claim 1, further comprising:
transmitting, by the controller to a notification system, a signal to cause the notification system to indicate that the flow-control subsystem is active.

5. The method of claim 1, further comprising:
determining, by the controller, a setting of a thermal component,
wherein the thermal component is associated with the impeller, the exhaust port, and/or a region surrounding the impeller and the exhaust port; and
transmitting, by the controller to the thermal component, a signal to cause the thermal component to maintain the impeller, the exhaust port, and/or the region to a temperature corresponding to the setting of the thermal component.

6. The method of claim 5, wherein determining the setting of the thermal component is based, at least in part, on an etching recipe associated with the plasma-based etching operation.

7. The method of claim 5, wherein determining the setting of the thermal component is based, at least in part, on a machine learning model that correlates the setting to one or more historical operating conditions,
wherein the one or more historical operating conditions comprise at least one of
an etching uniformity across a population of semiconductor substrates,
a dispersion of particulates across the population of semiconductor substrates, or
a yield of semiconductor product from the population of semiconductor substrates.

8. A method, comprising:
receiving, by a controller of a flow-control subsystem, an indication of a plasma-based etching operation commencing in a processing chamber,
wherein the flow-control subsystem includes an impeller located below a chuck within the processing chamber and above an exhaust port exiting the processing chamber, and
wherein the chuck, the exhaust port, and the impeller share a central axis;
determining, by the controller, a setting of a motor component connected to an impeller of the flow-control; and
transmitting, by the controller to the motor component, a signal to cause the motor component to rotate the impeller at a rotational velocity corresponding to the setting of the motor component.

9. The method of claim 8, wherein determining the setting of the motor component is based, at least in part, on an etching recipe.

10. The method of claim 8, wherein determining the setting of the motor component is based, at least in part, on a machine learning model that correlates the rotational velocity to one or more historical operating conditions.

11. The method of claim 8, further comprising:
transmitting, to a notification system, a signal to cause the notification system to indicate that the flow-control subsystem is active.

12. The method of claim 8, further comprising:
determining a setting of a thermal component associated with the impeller; and
transmitting, to the thermal component, a signal to cause the thermal component to maintain the impeller to a temperature corresponding to the setting of the thermal component.

13. The method of claim 12, wherein determining the setting of the thermal component is based, at least in part, on an etching recipe.

14. The method of claim 12, wherein determining the setting of the thermal component is based, at least in part, on a machine learning model that correlates the setting to one or more historical operating conditions.

15. A method, comprising:
determining, by a controller and based on an etching recipe, a first setting for a motor component of a flow-control subsystem and a second setting for a thermal component of the flow-control subsystem,
wherein the flow-control subsystem includes an impeller located below a chuck within a processing chamber and above an exhaust port exiting the processing chamber, and wherein the chuck, the exhaust port, and the impeller share a central axis;

providing, by the controller to the motor component, the first setting to cause the motor component to rotate the impeller at a rotational velocity corresponding to the first setting; and providing, by the controller to the thermal component, the second setting to cause the thermal component to maintain the impeller at a temperature corresponding to the second setting.

16. The method of claim 15, wherein the motor component comprises:

a servo motor.

17. The method of claim 15, wherein the thermal component comprises:

a heat-transfer component comprising a conduction heat-transfer component, a radiation heat-transfer component, or a convection heat-transfer component.

18. The method of claim 15, wherein the thermal component comprises:

a temperature sensor configured to provide feedback to the controller.

19. The method of claim 15, further comprising:

altering the first setting or the second setting based on an input received from a user interface.

20. The method of claim 15, wherein the rotational velocity is in a range of up to approximately 60 revolutions per minute.

\* \* \* \* \*